United States Patent [19]
Ullman et al.

[11] Patent Number: 5,903,583
[45] Date of Patent: May 11, 1999

[54] DIODE LASER COMPONENT WITH COOLING ELEMENT AND DIODE LASER MODULE

[76] Inventors: Christoph Ullman, Pferrer Hambuchen-Weu 12, Konigswinler, Germany, D-53638; Volker Krause, Kupferbergstrasse 4, Kirchheimbolanden, Germany, D-87287

[21] Appl. No.: 08/894,372

[22] PCT Filed: Feb. 21, 1996

[86] PCT No.: PCT/DE96/00265

§ 371 Date: Oct. 15, 1997

§ 102(e) Date: Oct. 15, 1997

[87] PCT Pub. No.: WO96/26560

PCT Pub. Date: Aug. 29, 1996

[30] Foreign Application Priority Data

Feb. 22, 1995 [DE] Germany ............................. 19506093

[51] Int. Cl.$^6$ ................................................ H01S 3/04
[52] U.S. Cl. ................................. 372/35; 372/34; 372/36; 372/43; 372/50
[58] Field of Search ................................. 372/34, 35, 36, 372/43, 50

[56] References Cited

U.S. PATENT DOCUMENTS

| | | | |
|---|---|---|---|
| 4,829,531 | 5/1989 | Kawaniahi et al. | 372/19 |
| 5,105,430 | 4/1992 | Mundinger et al. | 372/43 X |
| 5,267,252 | 11/1993 | Amano | 372/34 |
| 5,309,457 | 5/1994 | Minch | 372/34 |
| 5,544,184 | 8/1996 | Wolak et al. | 372/43 |
| 5,706,302 | 1/1998 | Shimizu | 372/36 |

FOREIGN PATENT DOCUMENTS

| | | | |
|---|---|---|---|
| 0508717A1 | 4/1992 | European Pat. Off. | 372/43 X |
| 0508717 | 10/1992 | European Pat. Off. | 372/43 X |
| 4315580 | 11/1994 | Germany | 372/43 X |
| 4315580A1 | 11/1994 | Germany | 372/43 X |

*Primary Examiner*—Brian Healy
*Attorney, Agent, or Firm*—Hoffman, Wasson & Gitler, P.C.

[57] ABSTRACT

A diode laser component has at least one cooling element and at least one laser diode arrangement provided on a mounting surface of the cooling element. The cooling element is produced as a multilayer material or substrate made of several stacked layers joined by their flat sides. These layers consist partially of a metal and partially of an insulating material and/or of a material with a smaller thermal expansion coefficient than metal. At least some of the layers form a cooling plane. At least one cooling channel through which a cooling medium flows is formed in the plane of at least one layer of said cooling plane by at least one recess formed in said layer. Passages or channels are provided for supplying and draining the cooling medium that flows through the cooling channel.

17 Claims, 6 Drawing Sheets

DIODE LASER COMPONENT WITH COOLING ELEMENT AND DIODE LASER MODULE

FIELD OF THE INVENTION

The invention relates to a diode laser component with a cooling element in the form of a multiple substrate and to a diode laser module.

BACKGROUND OF THE INVENTION

A diode laser component is an arrangement consisting of at least one diode laser or a diode laser arrangement with several diode lasers or emitters and a cooling element. In addition, in the diode laser component there can also be other components, for example, for triggering the diode laser or diode laser arrangement.

Multilayer cooling arrangements or cooling systems for electrical and electronic components are known, especially heat sinks for high power laser diodes or high power laser diode arrangements (U.S. Pat. No. 5,105,430).

In known cooling systems, cooling channels are formed in stacked layers through which a liquid cooling medium flows, for example water. These channels are typically microchannels which are formed in the layers in the immediate vicinity of the component to be cooled by three dimensional microstructures. This improves the cooling action by providing a surface which is as large as possible that comes into contact with the cooling medium. Using this heat sink can reduce the heat resistance by a factor of 2–5 relative to a convention conductive cooler.

Thus, for example, a cooling arrangement is known with a circulating cooling medium for cooling of solid-state diode lasers (U.S. Pat. No. 5,105,430) in which the component to be cooled is joined both electrically and thermally to the cooler. Microchannels are formed under the solid-state component. Feed and drain channels are in the cooling element for supply and removal.

Furthermore, an arrangement is known in which a large area cooler is produced by a host of microchannels under the surface to be cooled (U.S. Pat. No. 5,099,910). The particular feature in this known arrangement is the special form of meandering coolant guidance through the microchannels. The arrangement is generally suitable for cooling electronic components.

A cooling arrangement is known (U.S. Pat. No. 4,573,067) which is designed especially for compact integrated circuits. To increase the cooling and heat exchanger surface, cooling rods are housed in a chamber through which the cooling medium flows.

Finally, a cooling arrangement (U.S. Pat. No. 4,516,632) having a cross flow heat exchanger consisting of several structured sheets placed on top of one another is known.

The disadvantage in the known diode laser components or their coolers is that to achieve heat dissipation as efficient as possible they use microchannels, i.e., channels with a width less than 100 microns, and require relatively expensive production. In addition, the different coefficients of expansion of the cooling element and the chip material of the component to be cooled are ignored and the mechanical strength and possibilities of current feed are not optimally resolved.

Known cooling elements require, if the coolers are metallic and conductive, additional insulating foils for insulation or potential separation of the electrical components, especially between the anode and cathode of a diode laser. An additional difficulty arises when this insulating film, if it has a sealing function relative to the cooling medium, is deformed by the pressure of the cooling medium. For this reason, stresses in the solid-state component to be cooled are inevitable. They lead to premature damage of the solid-state component, such as the solid-state diode chip.

It is necessary to galvanically apply conductive layers as contact layers and printed conductors for reconductive coolers. These galvanically applied layers, however, generally have only very small thicknesses. Major ohmic losses occur and high current densities in the conductive layers are not possible, since they can lead to metallurgical alteration of the conductive layers, i.e., the printed conductors and contact surfaces.

Attempts have been made to match the coefficient of expansion of the cooling element to the coefficient of expansion of the chip material of the solid state-component, for instance, the coefficient of expansion of GaAs in solid-state diode lasers, by a corresponding choice of material. The materials to be considered here, however, have relatively low thermal conductivities.

The disadvantage in known metallic cooling elements having thin metal layers or metal foils is that the resistance of these cooling components to mechanical deformations is not very great. During or after an assembly process deformations are possible which then lead to stresses in the solid-state components provided on the cooling element and thus to a reduction of the service life of this component.

The object of the invention is to devise a diode laser component which avoids the disadvantages of known diode laser components and their cooling elements with the possibility of simple manufacture of the cooling element and optimum cooling action.

SUMMARY OF THE INVENTION

According to a first aspect of the invention, a matter of devising a diode laser component so that mechanical stresses, especially thermally induced mechanical stresses in the laser diode arrangement or in the corresponding chip, are prevented. For this reason, the material of the diode laser component or its cooling element has a coefficient of thermal expansion which is much less than the coefficient of thermal expansion of metal arranged in the multilayer material. The proportion of this material is chosen to be so large that the thermal strength of this material is greater than the thermal strength of the metal layers. The thermal expansion of the cooling element, at least on the assembly surface, is determined essentially by the layer of material with the smaller coefficient of thermal expansion.

Furthermore, the cooling element or the multiple substrate is preferably made symmetrical to the center plane so that the cooling element, in spite of the metal layers used, has an overall reduced or "braked" coefficient of expansion without the cooling element's bending during thermal cycles. The channels through which the heat transport medium flows are macrochannels in the cooling element, i.e. those with relatively large dimensions which are economically produced.

These channels are preferably accomplished by simple slots or recesses in one layer. These slots are closed by adjacent layers to form the respective channel. The required cooling action is achieved by the cooling medium's flow path having at least two such channels in different planes of the multiple substrate which are joined to one another by an opening. The flow of the cooling medium is then deflected not only in the area of this opening, cooling medium flows at least on one bordering layer in the axial direction, perpendicular to the center plane of the cooling element. Turbulent flow there causes much improved heat transfer between the cooling element and the cooling medium.

The macrostructure of the channels allows economical production of the cooling element without deterioration of the cooling action, since the impact of the cooling medium on the openings which join the two channels causes improved heat transfer by turbulence of the cooling medium.

The symmetrical structure also prevents arching of the cooling element when temperatures change and thus prevents additional stresses on the diode laser component provided on the cooling element. The choice of the number of layers and/or their thickness furthermore makes it possible to adjust the coefficient of thermal expansion of the cooling element such that it deviates not at all or only negligibly on the assembly surface from the coefficient of thermal expansion of the material of the laser diode arrangement, for example, Ga As.

Another important advantage is that strength or dimensional stability when exposed to mechanical loads is greatly improved by the proportion of ceramics.

In one improved embodiment the partial area or insert of ceramic and/or diamond and/or T-cBN extends over the entire width of the assembly surface.

In the cooling component, the copper layers and ceramic layers used are joined to one another on their surfaces preferably using DCB technique, without using auxiliary substances, so that the lower coefficient of thermal expansion of at least one ceramic layer can act directly to reduce the coefficient of thermal expansion of the entire multilayer cooling element. Thermal expansion of the copper layers is slowed down by at least one ceramic layer directly and without a flexible intermediate layer.

In one embodiment of the invention, the cooling element consists of several layers joined superficially to one another and stacked on top of one another. At least one layer is a metal layer, for example a copper layer, and at least one layer consists of a material which has a coefficient of thermal expansion which is lower than that of the metal at least in one partial area. The sequence of layers is formed symmetrically to the center plane which runs parallel to the surface sides of the cooling element. To form the cooling structure or cooling plane of the cooling element at least one layer is provided with at least one recess which has a slotted section to form at least one channel which extends in the plane of this layer. The recess is sealed by adjacent layers on the top and bottom. In the adjacent layers there are openings, spatially offset against one another, which discharge into the channel for supplying and removing the cooling medium flowing through the channel.

In the multilayer cooling component there can be several such cooling planes which are located functionally in series either with their inlets and outlets formed by the openings, or parallel to one another.

To achieve a cooling action or heat sink as effective as possible for the laser diode arrangement, in one embodiment of the invention, on either side of the cooling plane, there is one intermediate copper layer which is joined superficially to the cooling plane which, in turn, consists of copper. The intermediate copper layers are then provided in their outer sides with another external copper layer, and on one of these external layers is the laser diode arrangement, under the latter in the intermediate copper layer, reduce the coefficient of thermal expansion an insert or buried layer of diamond or T-cBN is placed which also improves thermal conductivity. The improved thermal conductivity of the inserted material in this embodiment being used at the same time as the heat spreader.

According to a second aspect of the invention, a diode laser module with potential-free cooling bodies is formed. This diode laser module is composed of a plurality of diode laser components which are joined to one another in a stack to form a module. The individual laser diode components, with respect to their contacts or contact surfaces formed by metal coatings, are made such that all diode laser arrangements or their laser diode arrangements lie electrically in series between two outer electrical connections by stacking, so that for triggering with the necessary power at higher voltage (total of the individual voltages of the laser diode arrangements) a low current common to all laser diode arrangements is sufficient. To prevent interactions between the current, metallic or conductive cooling body and the cooling medium, the cooling bodies of the individual diode laser components are stacked potential-free. These cooling components and, thus, especially the electrically conductive part of these cooling elements are electrically insulated relative to the current-carrying or voltage-carrying parts, especially relative to the metal coatings of the laser diode components, so that a voltage difference cannot build up between a cooling body and the cooling medium which flows through this cooling body.

BRIEF DESCRIPTION OF THE DRAWINGS

The invention is detailed below using the figures on embodiments.

DETAILED DESCRIPTION OF THE INVENTION

Figure 1:
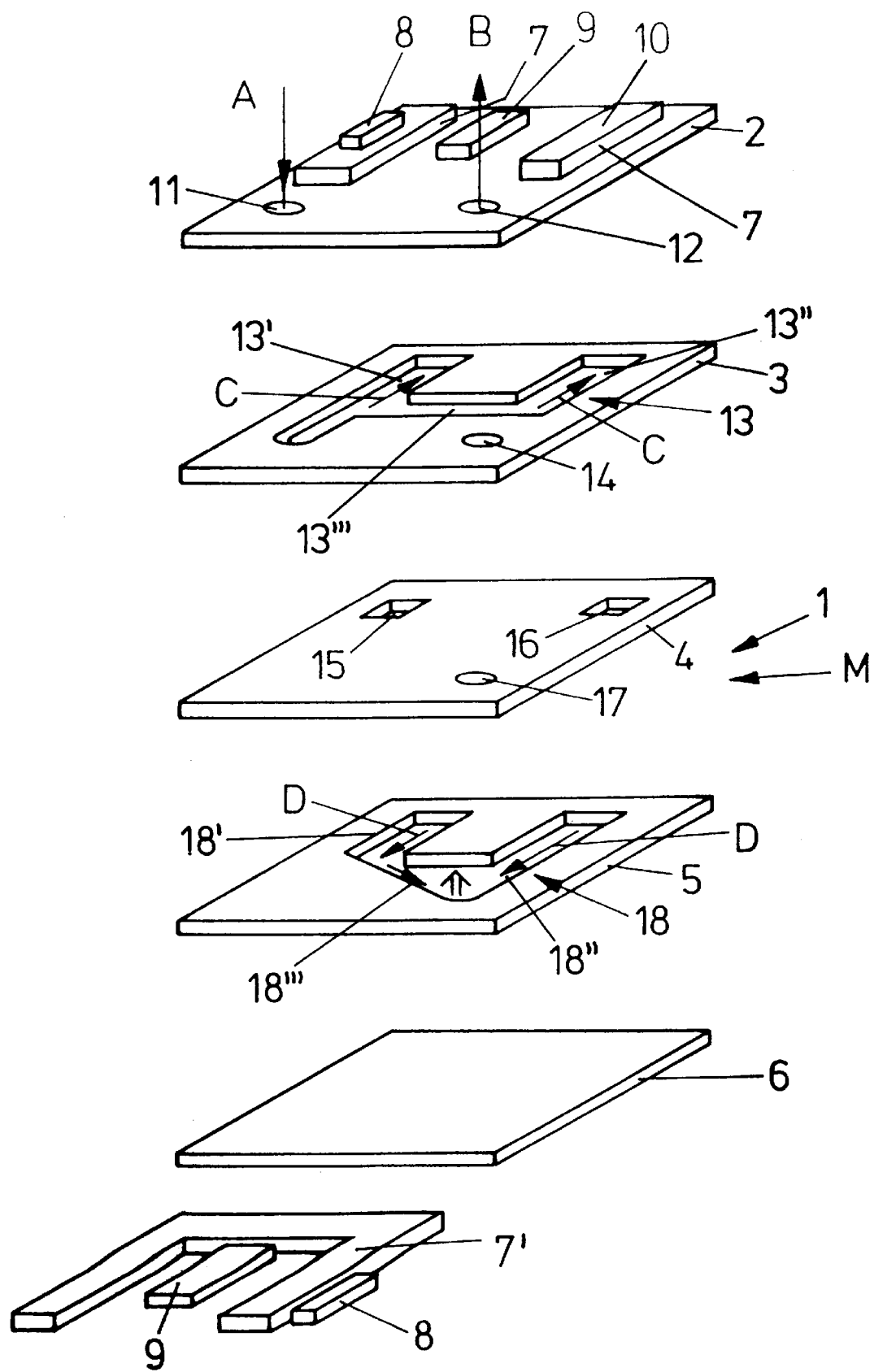
FIG. 1 shows in an exploded perspective view a diode laser component which has been produced using the cooling body or substrate as claimed in the invention.

FIG. 1 shows a multilayer substrate made at the same time as a cooling body or cooling component, consisting of a total of five layers. Layer 2 is the upper one in FIG. 1, made of ceramic, for example of an aluminum oxide ceramic ($AL_2O_3$). Copper layer 3 is formed by copper foil. Copper layer 4 likewise is formed from a copper foil. Copper layer 5 is formed by a copper foil. Ceramic layer 6 is an aluminum oxide ceramic.

All layers 2–6 in the embodiment have a quadratic pattern. Other patterns are also conceivable for these layers. Furthermore, all layers 2–6 each have the same size.

Printed conductors or contact surfaces 7 are on top of ceramic layer 2. Various electronic components 8–10 in the form of chips are also on top of the ceramic layer. They are attached to the top of ceramic layer 2 or to the printed conductors 7 and contact surfaces in a suitable manner using known techniques.

Outside of the area occupied by printed conductors 7 and components 8–10, ceramic layer 2 has two openings or passages 11 and 12. Passage 11 is used to supply cooling medium according to arrow A, and passage 12 is used to remove cooling medium according to arrow B. This cooling medium, which in the simplest case is water but which can also be another gaseous or liquid medium, is supplied and removed via channels which are not shown and which are joined tightly to passages 11 and 12.

There is a first opening 13 in copper layer 3 which is closed towards the periphery of this layer and which consists essentially of two parallel sections 13' and 13" which are joined to one another via section 13'''. Furthermore, opening 14 is separated from opening 13 in copper layer 3.

Copper layer 4 has a total of three window-like openings 15, 16, and 17 which are separate from one another and which are spatially offset against one another. A recess or opening 18 in copper layer 5, which like to opening 13, has two essentially parallel sections 18' and 18" and section 18''' which joins them to one another.

Passage openings 11 and 12 and openings 13–18 are arranged and oriented in the individual layers for layers 2–6 which are joined to one another, openings 13 and 18, with their sections 13'–13" or 18'–18''', form distributor channels. Each runs in the plane of these layers between ceramic layer 2 and copper layer 4 and between copper layer 4 and ceramic layer 6. Sections 13' and 18' run essentially parallel and congruently among one another, as do sections 13" and 18". Passage opening 11 discharges into section 13' in the area of one end of this section. The other end of section 13' is joined via window-like opening 15 to the end of section 18' away from section 18'''. The end of section 13''' away from section 13''' is joined via window-like opening 16 to the end of section 18" away from section 13'''. Openings 12, 14, and 17 each have the same cross section and are arranged congruently with one another and form a channel extending through layers 2–4 for returning the cooling medium which emerges from section 18'''. Window-like openings 15 and 16 in this embodiment have a cross section chosen so that the cooling medium in sections 13' and 13" and 18' and 18" is uniformly disturbed.

The cooling medium supplied via passage opening 11 in the channel arrangement formed by opening 13 is distributed to two sections 13' and 13". It flows in these sections from the front to the back in FIG. 1 (arrow C). After passage through openings 15, the cooling medium flows in sections 18' and 18" in the reverse direction, FIG. 1 (arrow D). A counterflow principle and thus cooling of substrate 1 uniform as possible.

It is also important that the cooling medium be repeatedly deflected as it flows through the substrate or the cooling channels formed in this substrate by openings 13 and 18, each time from one direction perpendicularly to the plane of the substrate into the flow direction which lies in this plane and vice versa. In this way, the cooling medium flows most intensely, especially on copper layer 4 and ceramic layer 6.

There are printed conductors or contact surfaces 7' and components 8–10 in the form of chips on the bottom of ceramic layer 6.

It is also essential in the described substrate that the material used for the layers is made symmetrical to a center plane which runs parallel to the top and bottom of substrate 1, the center plane of copper layer 4 in this embodiment. This symmetrical arrangement ensures that temperature changes of the substrate cannot lead to bimetal-like deformation. Using ceramic layers 2 and 6 ensures that the substrate has only a strongly reduced coefficient of thermal expansion compared to a substrate or cooling body consisting exclusively of metal or copper. While copper layers 3–5 have a coefficient of thermal expansion greater than $15 \cdot 10^{-6}$ $K^{-1}$, the coefficient of thermal expansion of ceramic layers 2 and 6 is clearly less than $10 \cdot 10^{-6}$ $K^{-1}$. The composite material which forms the substrate 1, has a greatly reduced coefficient of thermal expansion compared to copper. But, at the same time the substrate has high thermal conductivity. This applies not only to copper layers 3–5, but also to ceramic layers 2 and 6 so that a high cooling action is also achieved.

It goes without saying that layers 2–6 are joined superficially to one another to form substrate 1. For this reason the most varied techniques, for example the DCB process or active solder process, are suitable.

The above described design of substrate 1 or the configuration of the channels through which the cooling medium flows, especially in layers 2–6 joined to one another by soldering, also has the advantage that the exposure surfaces of the solder within the channels on which the cooling medium could act.

Figure 2:
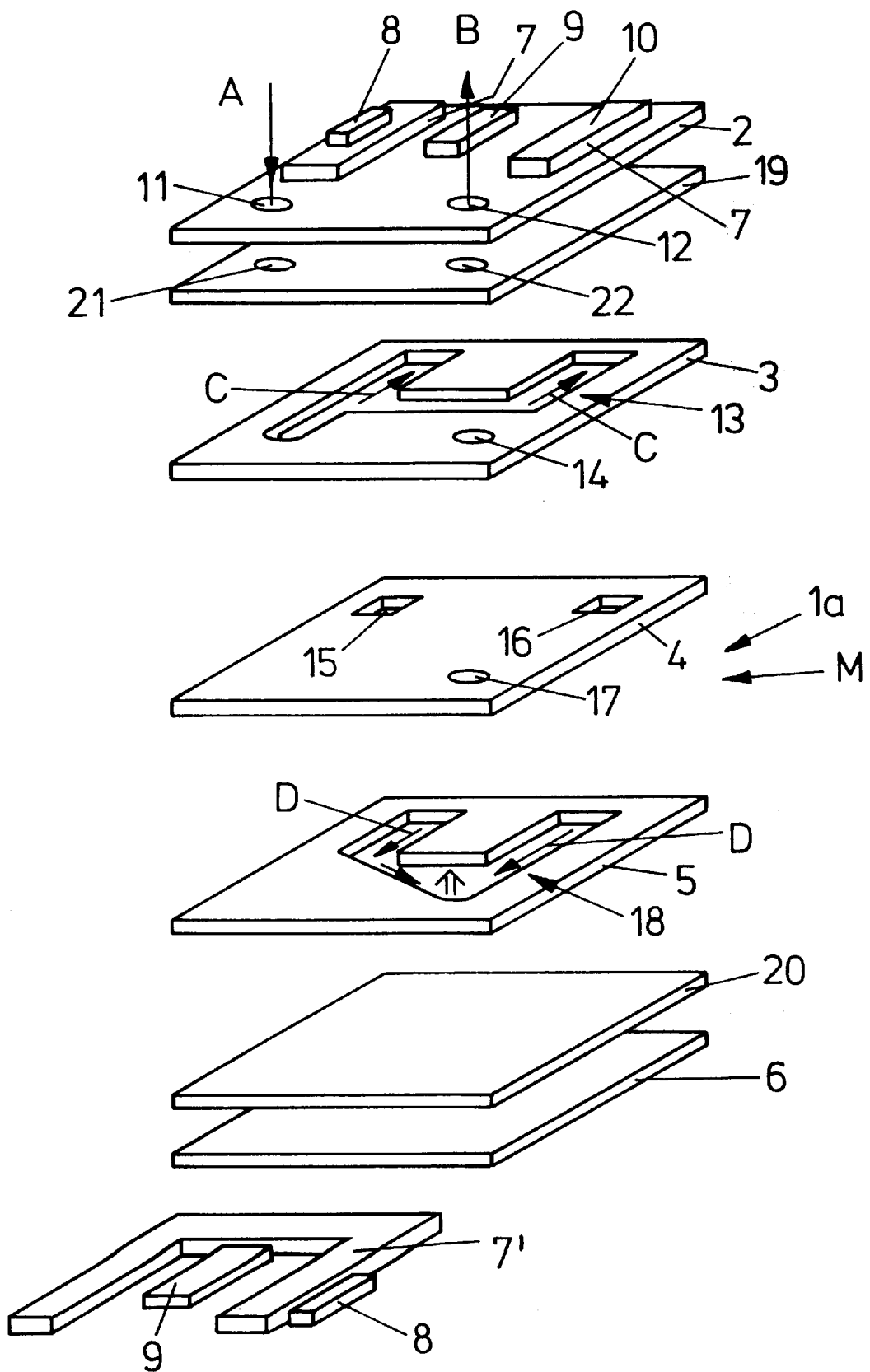
FIG. 2 shows a modified embodiment in a view similar to FIG. 1.

FIG. 2 shows substrate 1a which differs from substrate 1 essentially only in that there is one more layer 19 or 20 between layer 2 and layer 3 and between layer 5 and layer 6 respectively. In the embodiment shown it is a copper layer formed by a blank of copper foil. It provides for even more uniform dissipation of heat from ceramic layers 2 and 6. Layer 19 is provided with two openings 21 and 22 for passage of the cooling medium. Opening 21 is located congruently with opening 11 and opening 22 is located congruently with opening 12.

Production of substrate 1 is possible in the following manner:

1. Bring aluminum oxide ceramic to the size of layer 2 by scratching and breaking and then make openings 11 and 12 by a cutter or in some other manner;

2. Cut copper foil for the printed conductor and contact surfaces 7 to size;

3. Provide copper foil for printed conductor 7 with an oxide layer by heat treatment over three minutes at 400° C.;

4. Attach the copper layer for printed conductor 7 by means of a DCB process to ceramic layer 2. For this purpose, place copper foil for printed conductor 7 on ceramic layer 2 and treat it for 2.5 minutes at 1070° C. in protective gas with less than 40 ppmO$_2$.

5. Etching of the copper layer is of the composite produced in process step 4 for producing printed conductor 7 and the contact surfaces;

6. Cut to size and etch copper layer 3;

7. Cut to size and etch copper layer 4;

8. Cut to size and etch copper layer 5;

9. Bring aluminum oxide ceramic by scratching and breaking to the required size ceramic layer 6;

10. Cut copper foil for printed conductor 7' and the other contact surfaces to size;

11. Provide the cut copper foil with an oxide layer by heat treatment over three minutes at 400° C.;

12. Join the copper foil to ceramic layer 6 by a DCB process by placing the copper foil on ceramic layer 6 and by treatment for 2.5 minutes at 1070° C. in a protective gas atmosphere with less than 40 ppmO$_2$.

13. Production of printed conductor 7 and the other contact surfaces from the copper layer by etching;

14. Provide copper layers 3–5 with an oxide layer by heat treatment (at 400° C. for 3 minutes);

15. Place layer 2–6 on top of one another and join them by means of a DCB process, i.e. by treatment for 2.5 minutes at 1077° C. in protective gas with less than 40 ppmO$_2$.

Substrate 1a is produced in the same way, but with the additional measure of producing layers 19 and 20 by cutting to size and layer 19 or its openings 21 and 22 by etching.

The thickness of the individual layers is chosen, for example, as follows:

Layer 2 0.25–1 mm
Layer 3 0.3–3 mm
Layer 4 0.1–0.5 mm
Layer 5 0.3–3.0 mm
Layer 6 0.25–1.0 mm The thickness of additional layers 19 and 20 is for, example, 0.1–0.5 mm.

Recesses or openings 11–18 are each made through. They extend from the top to the bottom of the respective layer.

In the above described embodiment, 10 is a high-power laser diode or high-power laser diode chip with at least one emitters to deliver one or more laser beams. Additional components or chips 8 and 9 which are used for example to trigger the laser chip, but need not be present.

In the embodiments shown in FIGS. 1 and 2, multiple substrate 1 or 1a is used as the cooling element. It has two cooling planes formed essentially by copper layers 3 and 5 in conjunction with the respectively adjoining layers.

Figure 3:
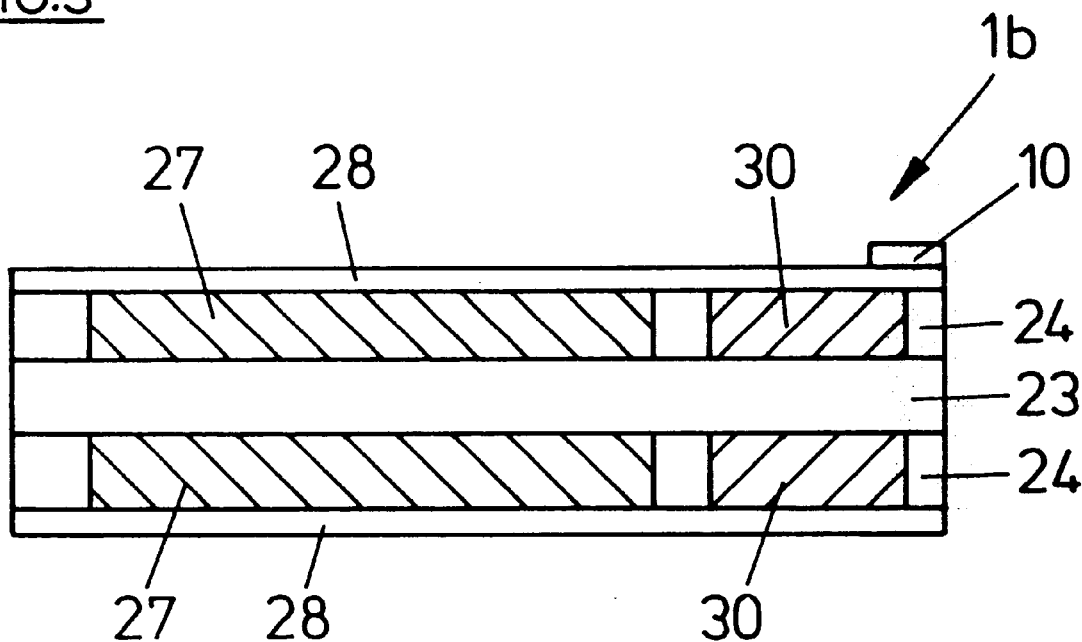
FIGS. 3–7 show, in very simplified representations, other preferred embodiments of the diode laser component with a cooling component.
Figure 4:
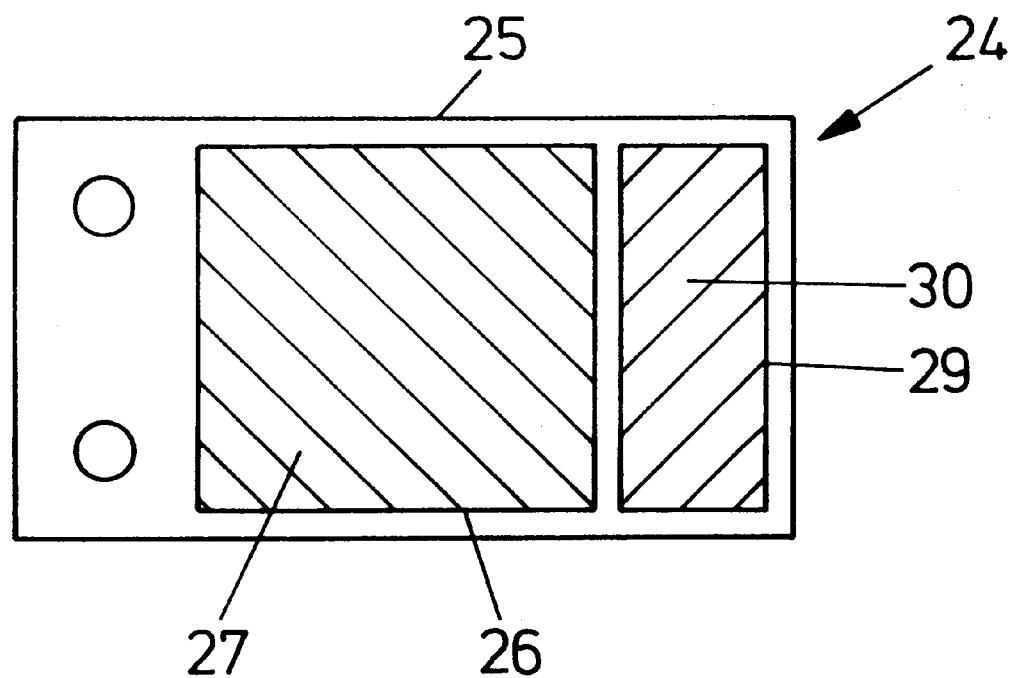
Figure 5:
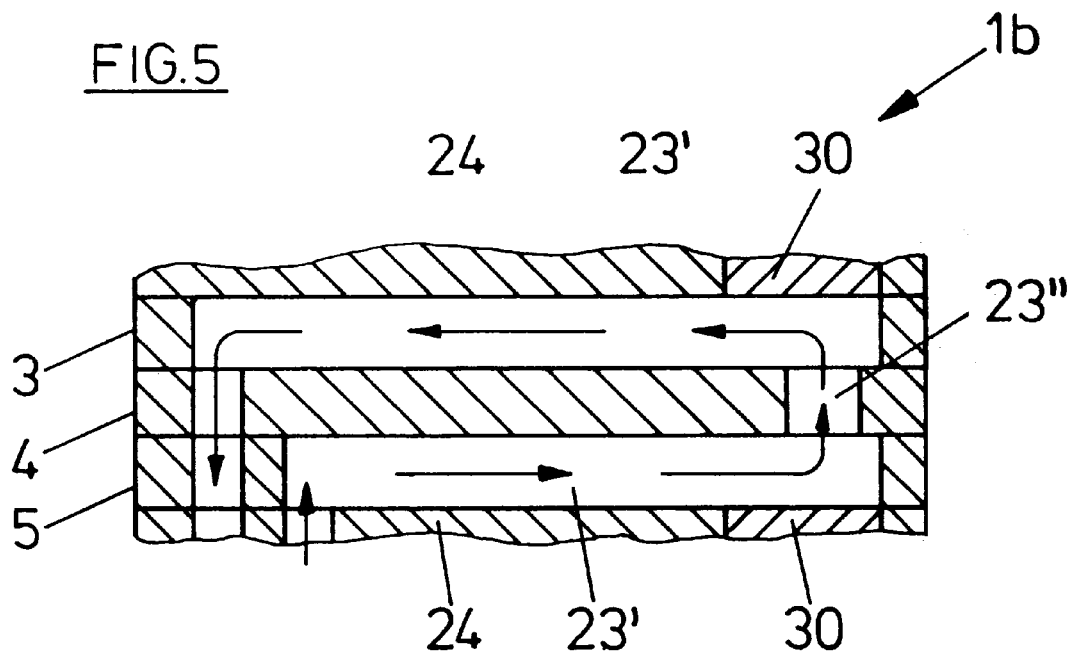

FIGS. 3–5 show other preferred embodiments of the invention. The substrate made at the same time as a cooling element in the embodiments of FIG. 3–6 is likewise symmetrical to center plane M.

In the embodiment shown in FIG. 3, substrate 1b encompasses cooling plane 23 on which there is one layer 24. Layer 24 is superficially joined to the cooling plane. As is shown in FIG. 4, each layer 24 consists of a foil or plate 25 of copper having openings 26 and 29. Ceramic plate-shaped insert 27, with a thickness equal to the thickness of the plate, is inserted into opening 26. Strip-shaped or rectangular insert 30, a material with high thermal conductivity, specifically of diamond or T-cBN, is inserted into opening 29. On the side, facing away from cooling plane 23, copper layer 28 is flatly attached to each layer 24. Upper copper layer 28, above insert 30, forms the mounting surface to which high power laser chip 10 is attached. The latter is located above insert 30 of upper layer 24. The active layer of high power laser diode arrangement 10 or the laser light-emitting emitter is in a plane parallel to the surface sides of copper layer 28. The so-called slow axis is in one axial direction perpendicular to the plane of the drawing of FIG. 3 and the so-called fast axis is perpendicular to the plane of copper layer 28. Insert 30 has a length perpendicular to the plane of the drawing of FIG. 3 is greater than the width of high power laser diode arrangement 10 in this axial direction.

Substrate 1b is produced, for example, by joining the copper layers which form the cooling plane and layers 24 with ceramic insert 27 in a first cycle using the DCB process. In a second cycle, using the active solder process, inserts 30, preferably provided with a metal coating, are soldered into two layers 24 or recesses 29. In a third process step or in the second process using active solder is applied to the outer surface sides of layer 24. Inserts 30 underneath high power diode arrangement 10 contribute significantly to the reduction of the coefficient of thermal expansion of substrate 1b especially in the area of the mounting surface. They also cause improved heat dissipation of lost heat from high power diode laser arrangement 10 to cooling plane 23. At the same time, the high thermal conductivity of the insert is also used as a thermal spreader.

Inserts 27 and 30 thus form buried areas which match the coefficient of thermal expansion of substrate 1b to the coefficient of thermal expansion of the chip material (GaAs) of diode laser arrangement 10.

FIG. 5 again shows, one possible version of cooling plane 23 in an enlarged representation to show detail. This cooling plane 23 in the embodiment shown consists of three copper layers 3, 4, and 5 which are superficially joined to one another. Copper layers 3 and 5 have channels 23' formed by recesses 13 and 18. Copper layer 4 has at least one passage 23" formed by openings 15 and 16. The cooling medium (for example, cooling water) flows through layers 3–5 or channels 23' and openings 23" in a flow direction opposite to FIGS. 1 and 2. At least one passage 23" is located in cooling plane 23 underneath insert 30 or underneath the mounting surface for high power laser diode arrangement 10. Improved heat transfer of lost heat to the cooling medium (cooling water) is achieved by impact of the cooling medium on the bottom of insert 30 after passing through passage 23". One special feature of this embodiment is that one insert 30 underneath the mounting surface is directly exposed to flow of the cooling medium.

The cooling plane 23 can also be made differently. Channels 23" are produced by through recesses 13 and 18 in layers 3 and 5, having the advantage that these channels can be produced especially easily.

Figure 6:
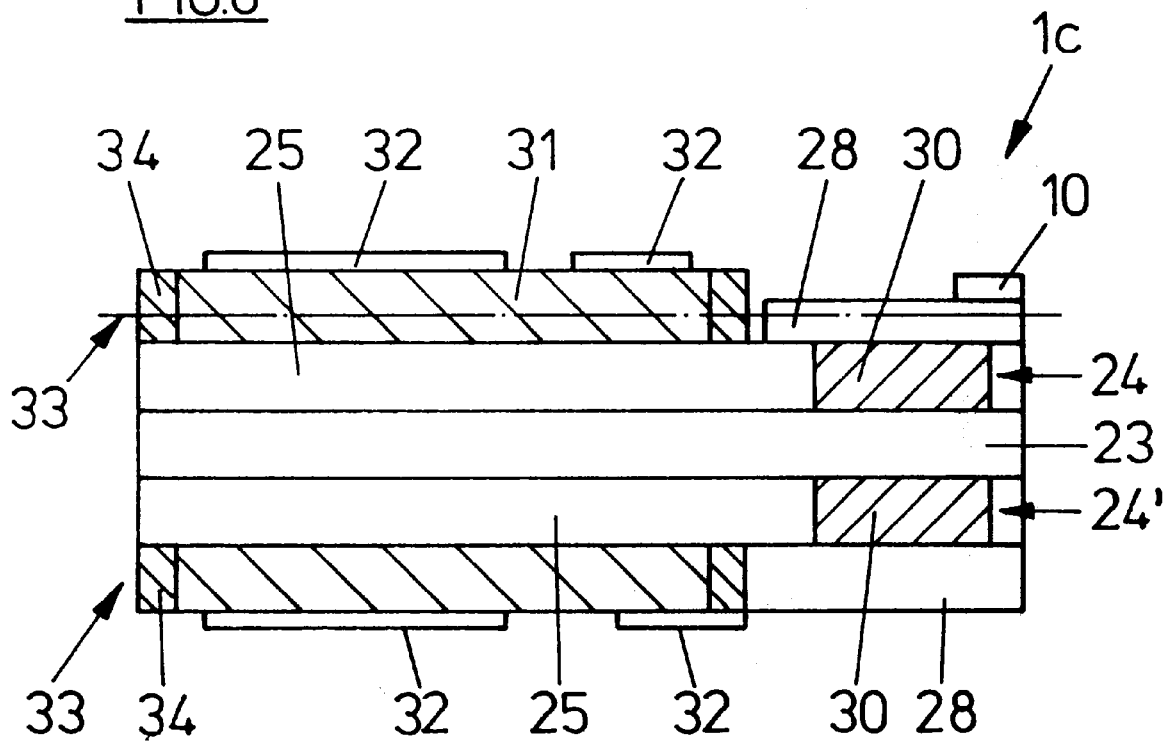

FIG. 6 shows another embodiment. Substrate 1c differs from substrate 1b in that outer copper layers 28, of which top upper copper layer 28 in turn forms the mounting surface for high power laser diode arrangements 10, extend only over a partial area of the top and bottom of substrate 1c, specifically above inserts 30. Instead of layers 24, layers 24' are used. The latter differ from layers 24 in that metal plate 25 does not have recess 26, nor is ceramic insert 27 present. Outer ceramic layer 31, to which another metal coating or metal layer 32 for the printed conductors is applied to the surface sides of layers 24' facing away from cooling plane 23.

In the substrate shown in FIG. 6, outer ceramic layers 31 are a component of partial layer 33 which, like layers 24, consists of a copper foil or plate 34. Outer ceramic layers 31 are then used as inserts into the recesses of this plate 34. Copper layer 28 completely covers respective insert 30, i.e., overlaps respective recess 29 for this insert. Electrical or thermal connections or bridges from outer copper layer 32 to layer 24 or the copper area can be produced via plate 34.

The function of ceramic insert 27 is performed by two outer ceramic layers 31 in substrate 1c. It is also possible to form each of layers 28 as a component of plate 34 or layer 33.

Substrate 1c is produced in one cycle using the DCB process. The layers which form cooling plane 23, layers 24' (without inserts 30), layers 33 with outer ceramic layers 31 and outer copper layers 32 which form the printed conductors are joined to one another by means of the DCB process. In a second process step metal-coated inserts 30 are soldered into recesses 29 with active solder. In the same process step or in a subsequent process step outer copper layers 28 are likewise attached with active solder.

In this embodiment, the multiple substrate is formed symmetrically to center plane M and inserts 30 are used to match the coefficient of thermal expansion of the multiple substrate on the mounting surface to the coefficient of thermal expansion of the chip material.

Figure 7:
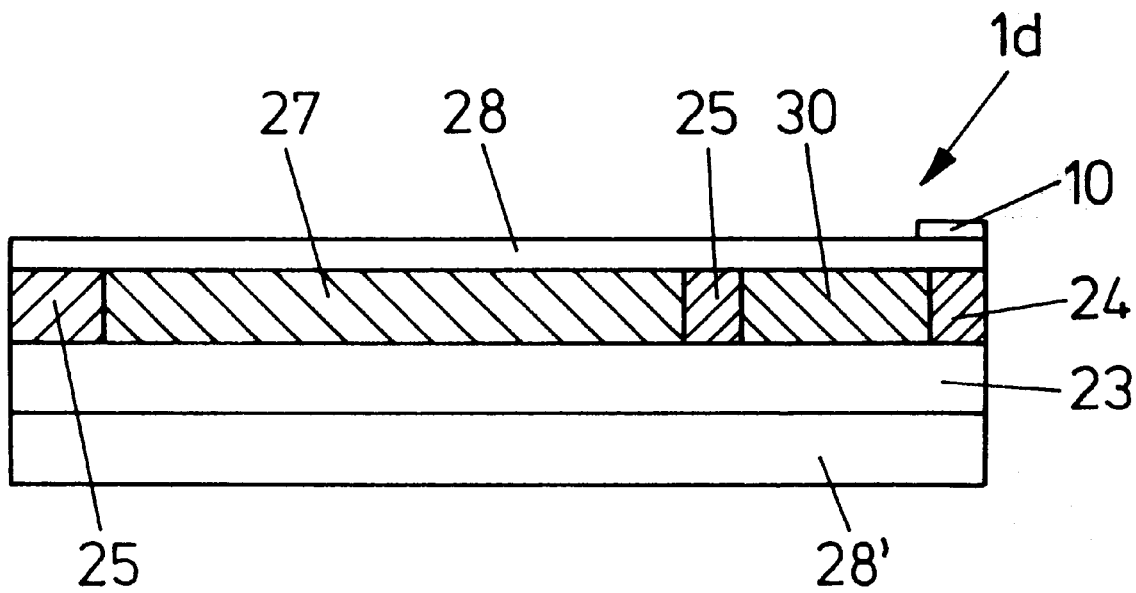

FIG. 7 shows another very simplified embodiment. Substrate 1d does not have the advantage of symmetrical structure and differs from substrate 1b of FIGS. 3–5 in that there are layers 24 and 28 on the top of cooling plane 23. On the bottom of the substrate, however, there is one metal or copper layer 28' which has a greater thickness compared to copper layer 28. This substrate 1d is produced using in a first common station, utilizing the DCB process. The layers forming cooling plane 23, layer 24 (with insert 27, but without insert 30) and layer 28' are superficially joined to one another. Subsequent insertion and attachment of insert 30 by active solder and attachment of upper copper layer 28, likewise with active solder, are done.

Furthermore, in the embodiments shown in FIGS. 3–7 it is also possible for layer 24 or 24' or the plate which forms this layer for its part to consist of several individual layers which are joined to one another by means of the DCB process.

Furthermore it is also possible, instead of copper layer 28, to galvanically deposit copper on layer 24', layer 24 or both. It is deposited on layer 24' after insertion of insert 30.

The buried construction, i.e. the use of the copper layer, has the advantage that mechanical posttreatment of the surfaces by metal cutting is possible. Furthermore, substrate 1c and 1d then also have optimum electrical properties since copper layer 28 has a relatively large thickness (greater than 100 microns) and thus a large electrical cross section for connection or operation of high power laser diode arrangement 10.

All the described embodiments have the general advantage that the channels through which the cooling medium flows have large dimensions. These channels can therefore be easily produced as macrochannels. Since, by deflecting the flow of the cooling medium directly underneath the respective component, the cooling medium is perpendicularly incident on a surface there. An optimum cooling effect is achieved by this turbulent flow. The coefficient of expansion of the mounting surface is matched to the chip material used for the components by the multiple layers of the respective cooling element or substrate using ceramic layers. The relatively large cross sections of the channels furthermore make it possible to keep the pressure difference of the pressure of the cooling medium between the inlet and outlet small within the cooling element, for example, less than 1 bar. In this way, a cooling system can be accomplished by operating below the ambient pressure. Emergence of cooling medium is therefore effectively prevented in that cooling system.

Figure 8:
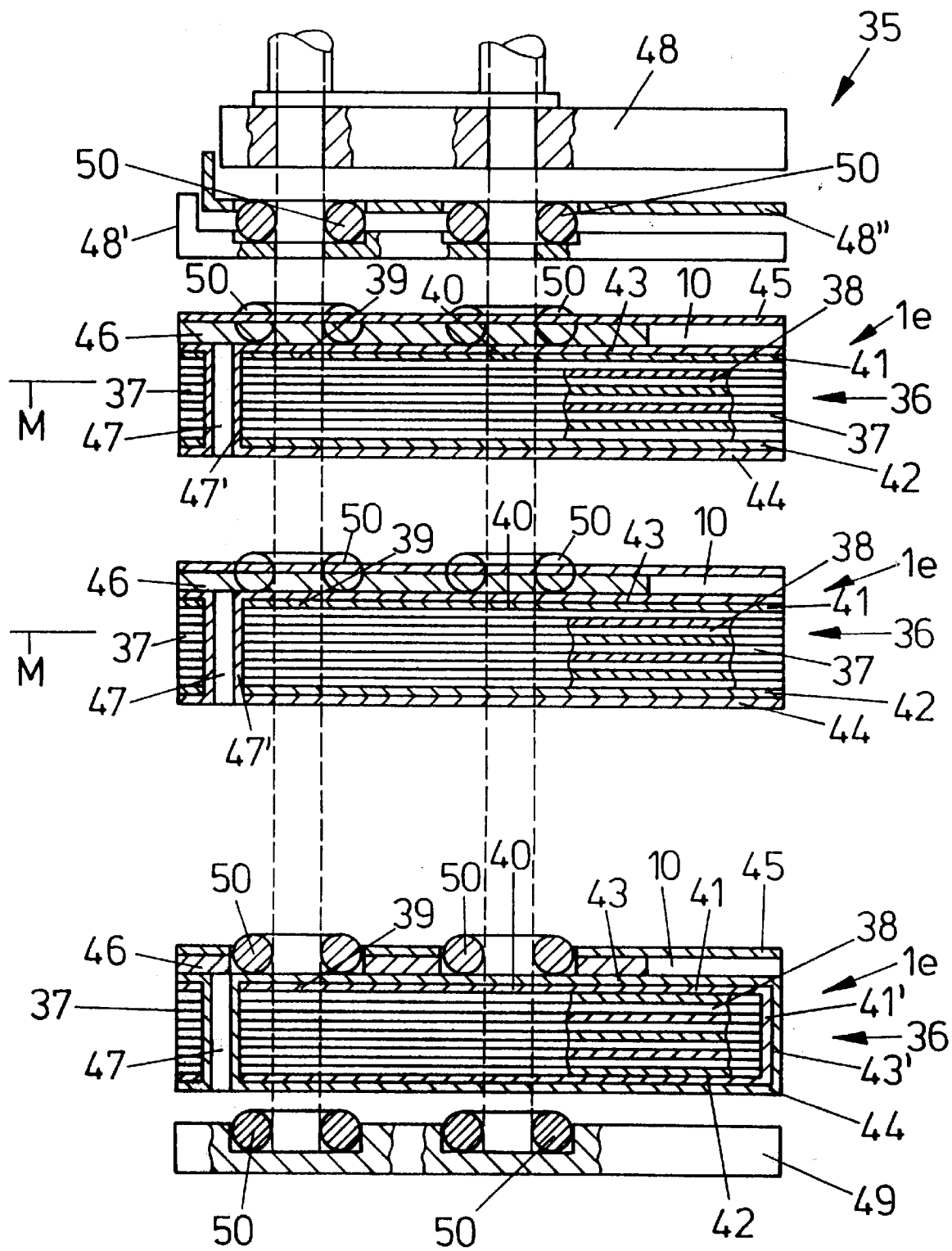
FIG. 8 shows in an exploded perspective view and in a side view a diode laser module which is formed by several diode laser components stacked on top of one another.

FIG. 8 shows in a simplified representation and, in a side view, diode laser module 35 which consists of a plurality of diode laser elements 1e which are stacked on top of one another and which are shown separately from one another in FIG. 8 for the sake of clarity. However, in module 35, they in fact tightly adjoin one another such that each element 1e with its bottom and/or top tightly adjoins one adjacent element at a time. Each element 1e consists of a heat sink or a cooling body 36. The cooling body consists of a plurality of copper layers 37 joined flat to one another and which are located in a packet-like manner on top of one another. The connection of the thin sheets forming copper layers 37 takes place by using the DCB technique. Layers 37 are structured such that in cooling body 36 cooling channels 38 are formed through which a liquid cooling medium flows. Cooling channels 38 are each joined to channels 39 and 40 which lie with their axes perpendicular to the top and bottom of respective diode laser element 1e and are formed continuously to extend from the top to the bottom of this element. In the module, these channels 39 and 40 form collecting channels which extend from the top of the module to the bottom of this module for delivering or removing the cooling medium to or from channels 38. In the embodiment shown, channels 39 form the supply and channels 40 form the return for the cooling medium.

Cooling body 36 has a layer of insulating material 41 on the top of a layer of insulating material 42 on the bottom. Metal coating 43 is applied to the side of layer 41 facing away from layers 37. Metal coating 44 is applied to the side of layer 42 facing away from layers 37. Metal coating 43 forms an electrical connection for laser diode arrangement 10, 10 attached to this metal coating. On the top of laser diode arrangement 10 there is another metal coating 45 which is used as a second electrical connection. The two metal coatings 43 and 45 are insulated from one another by insulating layer 46 (capton film).

The two metal coatings 43 and 44 are electrically connected to one another by through plating 47. Through-plating 47 is insulated (for example, by insulating sleeve 47') relative to cooling body 36 or layers 37 of electrically conductive material. The electrical connection between two metal coatings 43 and 44 can also be produced by joining these metal coatings to one another via edge area 43', electrically insulated by insulating layer 41'.

By stacking diode laser elements 1e on top of one another, with the exception of uppermost element 1e, each element with its upper metal coating 45 abuts lower metal coating 44 of overlying element 1e. An electrical connection is established between elements 1e which follow one another in the stack. Upper metal coating 45 of upper element 1e abuts connection element 48' produced from electrically conductive material and is used as an electrical connection. Connection element 48 is the connection for supplying and removing the cooling medium. It is electrically insulated by insulating element 48" against connection element 48'. Lower connection element 49, which is likewise made of electrically conductive material, forms an electrical connection, and which closes the supplies and returns for the cooling medium on the module bottom formed by collecting channels 39 and 40 located on the same axis, abutting the lower metal coating 44 of lowermost element 1e. By means of screws or other bracing elements which are electrically insulated routed through individual diode laser elements 1e and their electrically conductive layers, through connection element 48' and also through connection element 48 and 49, individual elements 1e are joined to one another in the stack to form module 35.

Via connection elements 48 and 49, all diode laser arrangements 10 of the module are electrically connected in series. The module can be operated at a low current and correspondingly high voltage with the required electrical power.

One particular feature of module 35 is t cooling bodies 36 or their conductive layers 37 are each voltage-free. The electrically conductive part of each cooling body 36 is not connected to a metal coating being used as the current conductor via any electrical bridge (ohmic connection).

This has the advantage that when liquid cooling medium flows through individual cooling bodies 36 during operation of the module, in cooling channels 38, but also in channels 39 and 40, there is no voltage difference anywhere between this cooling medium and the electrically conductive material. Interactions between the electrically conductive material of the metallic cooling body, the current and the cooling medium are prevented. If the cooling medium is electrically conductive an electrical voltage field forms between upper and lower connection 48 and 49. The electrically conductive parts or layers 37 of each cooling body 36 can each be set to the potential of the cooling medium on this part of cooling body 36.

Insulating layers 41 and 42 are, for example, ceramic layers of aluminum oxide or aluminum nitride ceramic. The connection of these layers to the electrically conductive part of respective cooling body 36 (layers 37) and/or to metal coatings 43 and 44 formed by the copper layers can in turn take place by DCB technique. Metal coatings 43 and 44 have a layer thickness from 100 to 200 microns. Metal coating 45 is formed by a copper foil joined to the laser diode element or to a contact by soldering. To improve heat dissipation, layer 41 can consist of another material such as diamond or T-cBN, at least underneath laser diode arrangement 10, diamond and/or T-cBN.

In this embodiment, cooling body 36 is formed by layer 41 and by other possible layers of ceramic or diamond and/or T-cBN. At least in the area of laser diode arrangement 10, it has a coefficient of thermal expansion which is at least roughly in the range of the chip material. Thermal stresses in the chip are prevented.

To prevent warping or deformation of respective cooling body 36 by thermal influences, each cooling body 36 is made as symmetrical as possible to center plane M with respect to the number and type of layers. Elastic O-rings are labeled 50. They seal channels 39 and 40 at the transitions between diode laser components 1e or the transitions to enclosures 48 and 49 to the outside for diode laser components 1e which abut one another flat in the stack.

The invention was described above by means of embodiments. It goes without saying that numerous modifications and versions are possible without departing from the inventive idea underlying the invention.

Thus, for example, it is possible to produce other layers from ceramic, for example layer 4. Preferably however those layers which form channel sections for the cooling medium which run parallel to the plane of the substrate, i.e. in this case layers 3 and 5, being produced from copper or another suitable metal.

Glasses or amorphous insulating layers for example of ceramic, especially also aluminum nitride ceramic, are used as the insulating material or layers.

We claim:

1. A diode laser comprising
a multilayer substrate;
a diode laser component having a coefficient of thermal expansion mounted on the multilayer substrate;
the multilayer substrate comprising a plurality of layers joined to one another forming a stack of layers including an upper and a lower layer and having a coefficient of thermal expansion;
openings and recesses in at least a part of the layers in between the upper layer and the lower layer, the openings and recesses are in communication forming a coolant distribution system inside multilayer substrate with a coolant inlet and a coolant outlet;
at least the layers with the recesses and openings forming the coolant distribution system being metal layers;
a means for matching the coefficient of thermal expansion of the multilayer substrate to the coefficient of thermal expansion of the diode laser component, the means being a layer or insert of a material which has a coefficient of thermal expansion which is much less than the coefficient of thermal expansion of the metal layers;
the arrangement and formation of layers of the multilayer substrate being symmetrical to a center plane (M) which runs parallel to the upper layer and the lower layer.

2. The diode laser of claim 1 wherein;
the metal layers of the multilayer substrate is copper.

3. The diode laser of claim 1 wherein;
the means for matching the coefficient of thermal expansion of the substrate to the coefficient of thermal expansion of the diode laser component is a layer of ceramic.

4. The diode laser of claim 3 wherein;
the ceramic is aluminum nitride.

5. The diode laser of claim 1 wherein;
the insert is diamond.

6. The diode laser of claim 1 wherein;
the insert is T-BN.

7. The diode laser of claim 1 wherein;
the upper layer is metal.

8. The diode laser of claim 7 wherein;
the upper layer is smaller than other layers in the substrate.

9. a laser diode comprising;
a multilayer substrate;
a laser diode component mounted on the multilayer substrate having a first layer with a coolant inlet and a coolant outlet;
a second layer with a coolant outlet and a first coolant distribution system,
the first coolant distribution system having at least two channels, the at least two channels connecting with one another and extending all the way through the second layer;
a third layer having at least one coolant inlet and a coolant outlet;
a fourth layer having a second coolant distribution system having at least two channels, the two channels connecting with one another and extending all the way through the fourth layer.

10. The laser diode of claim 9 further comprising:
a fifth layer having a coolant inlet and a coolant outlet, the fifth layer being between the first and second layer.

11. The laser diode of claim 9 wherein;
the first layer is ceramic.

12. The laser diode of claim 9 wherein;
the second, third and fourth layers are metal.

13. A diode laser module comprising;
a plurality of diode laser modules stacked on one another forming a stack;
a first connection element on top of the diode laser modules stack,
a second connection element on bottom of the diode laser module stack,
the first and second connection elements being made of electrically conductive material, each diode laser module comprising;
a cooling body,
a first layer of ceramic on top of the cooling body,
a second layer of ceramic on bottom of the cooling body,
an upper and lower coating on the exterior of the first and second ceramic layers, the upper and lower coating being electrically connected,
an insulating layer of top of the upper coating, the insulating layer containing a laser diode, and
a top metal layer above the insulating layer.

14. The diode laser module according to claim 13, wherein:
the cooling body is a plurality of metal plates.

15. The diode laser module according to claim 14 wherein;
the plurality of metal plates are spaced from one another.

16. The diode laser module according to claim 13 wherein;
each diode laser module has an inlet coolant channel and an outlet coolant channel.

17. A diode laser of claim 1 wherein said means for matching the coefficient of thermal expansion of the substrate to the coefficient of thermal expansion of the diode laser component being a layer or insert of BeO.

* * * * *